(12) United States Patent
Sterling et al.

(10) Patent No.: US 11,064,637 B2
(45) Date of Patent: Jul. 13, 2021

(54) SYSTEMS AND METHODS FOR MAGNETIC SHIELDING FOR A SUPERCONDUCTING COMPUTING SYSTEM

(71) Applicant: D-Wave Systems Inc., Burnaby (CA)

(72) Inventors: George E. G. Sterling, Vancouver (CA); Gregory D. Peregrym, Port Moody (CA); Edmond Ho Yin Kan, Burnaby (CA)

(73) Assignee: D-WAVE SYSTEMS INC., Burnaby (CA)

( * ) Notice: Subject to any disclaimer, the term of this patent is extended or adjusted under 35 U.S.C. 154(b) by 323 days.

(21) Appl. No.: 16/218,150

(22) Filed: Dec. 12, 2018

(65) Prior Publication Data

US 2019/0182995 A1 Jun. 13, 2019

Related U.S. Application Data

(60) Provisional application No. 62/598,296, filed on Dec. 13, 2017.

(51) Int. Cl.
| | |
|---|---|
| *H05K 9/00* | (2006.01) |
| *G01R 33/035* | (2006.01) |
| *H01L 27/18* | (2006.01) |
| *G06N 10/00* | (2019.01) |
| *B82Y 10/00* | (2011.01) |

(52) U.S. Cl.
CPC ......... *H05K 9/0077* (2013.01); *G01R 33/035* (2013.01); *G01R 33/0358* (2013.01); *H01L 27/18* (2013.01); *B82Y 10/00* (2013.01); *G06N 10/00* (2019.01); *Y10S 505/872* (2013.01)

(58) Field of Classification Search
CPC ................ H05K 9/0077; G01R 33/035; G01R 33/0358; H01L 27/18; H01L 39/14; H01L 39/12; Y10S 505/872; G06N 10/00; B82Y 10/00
See application file for complete search history.

(56) References Cited

U.S. PATENT DOCUMENTS 9,913,414 B2 * 3/2018 Sadleir ................ G01R 33/025

OTHER PUBLICATIONS

Claycomb, J. R., and J. H. Miller Jr. "Superconducting magnetic shields for SQUID applications." Review of Scientific Instruments 70.12 (1999): 4562-4568. (Year: 1999).*

* cited by examiner

*Primary Examiner* — Daniel Cavallari
(74) *Attorney, Agent, or Firm* — Conzen O'Connor (57) ABSTRACT

A magnetic shielding system that includes a shield that is non-uniform in the axial direction and a shield cap that is non-uniform in the radial direction. Each shield in the system may have a magnetic permeability, thickness, and/or radius that varies in the axial direction to create low-reluctance paths that redirect flux away from a sample towards the ends of the shield. Each shield cap in the system may have a magnetic permeability and/or thickness that varies in the radial direction to create low-reluctance paths that redirect flux away from the sample towards shield walls. An inner shielding layer formed from a material of low permeability and moderate-to-high coercivity may be implemented as the innermost layer of a magnetic shielding system.

10 Claims, 9 Drawing Sheets

SYSTEMS AND METHODS FOR MAGNETIC SHIELDING FOR A SUPERCONDUCTING COMPUTING SYSTEM

FIELD

This disclosure generally relates to magnetic shielding systems and particularly relates to providing a low magnetic field environment for a superconducting computing system by creating a low reluctance path around a region where a superconducting processor is positioned.

BACKGROUND

Quantum Processor

A computer processor may take the form of an analog processor, for instance a quantum processor such as a superconducting quantum processor. A superconducting quantum processor may include a number of qubits and associated local bias devices, for instance two or more superconducting qubits. Further detail and embodiments of exemplary quantum processors that may be used in conjunction with the present systems, methods, and apparatus are described in at least U.S. Pat. Nos. 7,533,068, 8,195,596, 8,190,548, and U.S. Patent Application No. 2011-0022820.

A superconducting quantum processor may include a number of coupling devices operable to selectively couple respective pairs of qubits. Examples of superconducting coupling devices include rf-SQUIDs and dc-SQUIDs, which couple qubits together by flux. SQUIDs include a superconducting loop interrupted by one Josephson junction (an rf-SQUID) or two Josephson junctions (a dc-SQUID). The coupling devices may be capable of both ferromagnetic and anti-ferromagnetic coupling, depending on how the coupling device is being utilized within the interconnected topology. In the case of flux coupling, ferromagnetic coupling implies that parallel fluxes are energetically favorable and anti-ferromagnetic coupling implies that anti-parallel fluxes are energetically favorable. Alternatively, charge-based coupling devices may also be used. Other coupling devices can be found, for example, in U.S. Patent Publication No. 2006-0147154 (now granted as U.S. Pat. No. 7,619,437) and U.S. patent application Ser. No. 12/017,995 (now published as U.S. 2008-0238531 A1). Respective coupling strengths of the coupling devices may be tuned between zero and a maximum value, for example, to provide ferromagnetic or anti-ferromagnetic coupling between qubits.

Superconducting Processor

A computer processor may take the form of a superconducting processor, where the superconducting processor may not be a quantum processor in the traditional sense. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting processors. Due to their natural physical properties, superconducting processors in general may be capable of higher switching speeds and shorter computation times than non-superconducting processors, and therefore it may be more practical to solve certain problems on superconducting processors.

Refrigeration

According to the present state of the art, a superconducting material may generally only act as a superconductor if it is cooled below a critical temperature that is characteristic of the specific material in question. For this reason, those of skill in the art will appreciate that an electrical system that implements superconducting components may implicitly include a refrigeration system for cooling the superconducting materials in the system. Systems and methods for such refrigeration systems are well known in the art. A dilution refrigerator is an example of a refrigeration system that is commonly implemented for cooling a superconducting material to a temperature at which it may act as a superconductor. In common practice, the cooling process in a dilution refrigerator may use a mixture of at least two isotopes of helium (such as helium-3 and helium-4). Full details on the operation of typical dilution refrigerators may be found in F. Pobell, Matter and Methods at Low Temperatures, Springer-Verlag Second Edition, 1996, pp. 120-156. However, those of skill in the art will appreciate that the present systems and devices are not limited to applications involving dilution refrigerators, but rather may be applied using any type of refrigeration system.

Shielding and Noise

Magnetic fields produced by external sources may cause unwanted interactions with devices in the integrated circuit. Accordingly, there may be a need for a superconducting shield proximate to devices populating the integrated circuit to reduce the strength of interference such as magnetic and electrical fields.

Superconducting shielding incorporated into an integrated circuit can be used to protect superconducting quantum interference device (SQUID) packages from DC and AC noise, such as magnetic and electrical fields, that would otherwise interfere with operation of the integrated circuit. Regions of the integrated circuit can be unshielded to allow for communication between magnetic and electrical fields external to the SQUID package. An example of this approach is discussed in U.S. Pat. No. 5,173,660.

Supercurrent flowing in superconducting wires has an associated magnetic field in the same manner as electrons flowing in normal metal wires. Magnetic fields can couple inductively to superconducting wires, inducing currents to flow. Quantum information processing with superconducting integrated circuits necessarily involves supercurrents moving in wires, and hence associated magnetic fields. The quantum properties of quantum devices are very sensitive to noise, and stray magnetic fields in superconducting quantum devices can negatively impact the quantum information processing properties of such circuits.

Magnetic Shielding Systems

A typical magnetic shielding system employs multiple concentric cylindrical shields and shield caps formed from a material that has a high magnetic permeability, such as mu-metal. The magnetic shielding system shields a sample by minimizing reluctance at shield walls and redirecting flux lines away from the sample. Typically, the sample is positioned at the center of a middle portion of the innermost cylindrical shield. The middle portion can be defined as a region between the two ends of the shield. An example of a sample that requires shielding from external magnetic fields is a superconducting quantum processor.

A conventional magnetic shielding system also employs shield caps that cover the ends of a shield to prevent flux leakage. For cylindrical shields, hemispherical and conical shield caps have been explored as a method for shielding longitudinal fields as such geometries redirect flux away from the sample towards shield walls by increasing flux path length. However, Burk and Ekstrom (2002) found that shield cap geometry does not contribute significantly to shielding longitudinal fields in comparison to other considerations such as shield geometry and spacing between shield layers.

Certain features of a shielding system can be adjusted to optimize shielding, for example, the number of shield layers and spacing between shield layers. Some characteristics of a shield or a shield cap that can be exploited to optimize shielding include thickness and magnetic permeability. For a cylindrical shield, thickness can be defined as the difference between an outer radius and an inner radius. For a material, magnetic permeability can be defined as the ratio of magnetic flux density B to external field strength H. Conventional shields are uniform and formed from a high permeability material. Such shields create low-reluctance paths at the shield walls, redirecting flux away from the sample. Thus, typical shields redirect flux mainly in the radial direction. In some cases, it can be advantageous to have a shield that is thick (i.e., outer radius is much greater than the inner radius). However, such shields can be costly or difficult to manufacture. To address this, most magnetic shielding system designs employ multiple nested cylindrical shields, wherein each shield has a magnetic permeability and thickness that is constant in the axial direction. An example of a magnetic shielding system that includes uniform multi-layer cylindrical shields formed from a high permeability material is described in U.S. Pat. No. 8,355,765.

Uniform cylindrical shields with a constant permeability and thickness, even if arranged concentrically, are typically ineffective at redirecting flux lines in the axial direction. There is thus a general desire for systems and methods for magnetic shielding that effectively redirect flux lines in both the radial and the axial direction to achieve a uniform low-magnetic field environment. The foregoing examples of the related art and limitations related thereto are intended to be illustrative and not exclusive. Other limitations of the related art will become apparent to those of skill in the art upon a reading of the specification and a study of the drawings.

BRIEF SUMMARY

There exists a need to be able to process at least some problems having size and/or connectivity greater than (and/or at least not fully provided by) the working graph of an analog processor. Computational systems and methods are described which, at least in some implementations, allow for the computation of at least some problem graphs which have representations which do not fit within the working graph of an analog processor (e.g. because they require more computation devices and/or more/other couplers than the processor provides).

A magnetic shielding system for use with a superconducting computing system may be summarized as including: a shield having a thickness defined by an outer surface and an inner surface, the inner surface bounding an inner volume with a center longitudinal axis, and a magnetic permeability that varies along at least a portion of an axial direction; and a shield cap that is non-uniform in a lateral direction and is detachably joined to a first end of the shield, the shield cap having an opening shaped to accommodate electrical wiring and a flange projecting from a perimeter of the shield cap, wherein the flange fits to the outer surface of the shield.

The thickness may decrease along the at least a portion of the axial direction as the shield is traversed from the first end to the middle portion of the shield, the thickness sized to minimize reluctance at the first end of the shield. The outer surface may curve longitudinally inward towards the center longitudinal axis. The inner surface may curve longitudinally outward away from the center longitudinal axis. The inner surface and the outer surface may curve longitudinally outward away from the center longitudinal axis. The shield may include a first material selected from a group of: mu-metal, permalloy, and ferrite. The shield may further include at least a second material that has a lower magnetic permeability than the first material, the second material forming a substantial part of a middle portion of the shield. The shield may further include a plurality of materials, each material having a different magnetic permeability, the shield exhibiting a magnetic permeability gradient as the shield is traversed from the first end to the middle portion of the shield along the axial direction. The shield cap may have a thickness that increases as the shield cap is traversed from the center longitudinal axis to the perimeter, the thickness sized to minimize reluctance at the perimeter. The shield cap may include a plurality of materials, each material having a different magnetic permeability, the shield cap exhibiting a magnetic permeability gradient as the shield cap is traversed from the center longitudinal axis to the perimeter along at least a portion of a lateral direction. The shield cap may have a thickness that increases as the shield cap is traversed from the center longitudinal axis to the perimeter, the thickness sized to minimize reluctance at the perimeter.

A magnetic shielding system for use with a superconducting computing system may be summarized as including: a first and a second shield cap, each shield cap having a thickness that varies in along at least a portion of a lateral direction, a magnetic permeability that varies along at least a portion of the lateral direction, and an opening shaped to accommodate electrical wiring; a first shield having an inner volume bound by an inner surface of the first shield, the first shield cap, and the second shield cap; a superconducting shield that is at least partially enclosed in the inner volume of the first shield; wherein the first shield has a magnetic permeability and a thickness that both vary along an axial direction; the first shield cap is detachably joined to a first end of the first shield; and the second shield cap is detachably joined to a second end of the first shield, the second end positioned opposite to the first end.

The magnetic shielding system may further include a second shield that has an inner volume, wherein the first shield is at least partially enclosed in the inner volume of the second shield, and the second shield is detachably joined to a third shield cap at a first end of the second shield.

The magnetic shielding system may further include a fourth shield cap that is detachably joined a second end of the second shield, the second end of the second shield positioned opposite to the first end of the second shield.

The first shield and the second shield may each include at least one material selected from the group of: mu metal, permalloy, and ferrite. The superconducting shield may at least partially enclose at least a portion of the superconducting computing system.

A magnetic shielding system for use with a superconducting computing system may be summarized as including: a first shield that is formed from a first material of high magnetic permeability, the first shield having an inner volume; a second shield that is formed from a second material of high magnetic permeability, the second shield having an inner volume, wherein the second shield is at least partially enclosed in the inner volume of the first shield; and an inner shielding layer that is formed from a third material of a lower magnetic permeability and a higher coercivity than the first material and the second material, wherein the inner shielding layer is at least partially enclosed in the inner volume of the second shield.

The magnetic shielding system may further include a third shield that is formed from the first material, the third shield interposed between the first shield and the second shield such that the third shield at least partially encloses the second shield and is at least partially enclosed within the first shield.

The magnetic shielding system may further include a fourth shield that is formed from the second material, wherein the fourth shield at least partially encloses the first shield, the second shield, the third shield, the inner shielding layer, and at least a portion of a superconducting computing system.

The third material may include at least one of the following: nickel, iron, and molybdenum.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

In some implementations, superconducting devices operate at cryogenic temperatures, for example, temperatures of less than 100 mK that are provided by a cryogenic refrigeration system or cryostat. The devices can be communicatively coupled to other devices or electronics operating proximate to the refrigeration system or outside the refrigeration system at room temperature. An example of a superconducting device that operates at cryogenic temperatures is a quantum processor comprising at least one superconducting flux quantum bit or "qubit". A flux qubit or SQUID is a superconducting inductive loop interrupted by a number of Josephson junctions. A flux qubit typically comprises at least two parallel Josephson junctions and has components that are relatively sensitive to external magnetic fields. Flux qubits can couple to undesirable external flux noise (1/f) sources if external fields are inadequately shielded. External fields can affect the flow of electrons in the critical current $I_c$ which can cause fluctuations in the critical current split. Uneven critical current split can result in dephasing and decoherence as qubits evolve from the initial state to the ground state. Decreased coherence reduces qubit readout fidelity and can result in systematic errors in the implementation of qubit bias and coupling strengths. Thus, it is essential to shield superconducting devices such as superconducting qubits or couplers from external magnetic fields.

Reluctance $\mathcal{R}$ is resistance to flow of magnetic flux and can be defined as follows:

$$\mathcal{R} = \frac{l}{\mu A}$$

where l is geometric distance or length of flux path, μ is magnetic permeability, and A is cross-sectional area. Generally, a sample (e.g., circuit, integrated circuit or "chip") that requires shielding is positioned at the center of an inner volume of a magnetic shielding system. Some magnetic shielding systems operate on the principle of minimizing magnetic reluctance at shield walls to create preferential flux paths that move away from a sample. This can be achieved by employing a high permeability material or increasing shield thickness or number of shield layers to establish a large cross-sectional area. Additionally, increasing flux path length to the sample causes reluctance to be relatively lower at shield walls than at the sample, resulting in redirection of flux away from the sample.

Conventional magnetic shielding systems employ a number of concentric cylindrical shields, each shield having two opposing ends and a middle portion interposed between the two ends. Typically, a sample is held at or proximate to the center of the middle portion of the innermost shield. Generally, shields are formed from a high permeability ferromagnetic material. The material may be a soft ferromagnetic alloy that comprises nickel and iron. For example, mu-metal, permalloy, or Cryoperm®, which is commercially available from MuShield Co., can each be employed. Mu-metal and permalloy are commonly used materials for shielding static or low-frequency fields. Another material that can be employed as shielding material is a nanocrystalline soft ferrite such as Finemet® which is commercially available from Hitachi Metals, Ltd. Shields that are formed from these materials may operate at a range of temperatures from room temperature to cryogenic temperatures.

In some cases, it can be advantageous to have a shield formed from superconducting material operating at cryogenic temperatures. Examples of such materials can include aluminum, tin, and copper. A superconducting shield may be nested inside a number of high permeability shields that operate at either cryogenic temperatures or room temperature. For example, a superconducting shield that encloses a sample can be positioned in the inner volume of a Finemet® shield, and both shields can operate at below a critical temperature. In another implementation, a mu-metal shield that operates at room temperature may at least partially enclose a cryostat and the superconducting shield. The cryostat and superconducting shield may operate at below a critical temperature (e.g., cryogenic temperatures). Alternatively, there can be more than one Finemet® shield, more than one mu-metal shield, or multiple Finemet® and mu-metal shields forming the shielding system.

Typically, high magnetic permeability materials have low magnetic saturation. Saturation is reached when applied external fields cannot increase the degree of magnetization of the material any further. Degaussing coils can be used to remove residual magnetization or remanence from a shield formed from a material that has high permeability and low saturation. Degaussing involves applying an alternating magnetic field to the shield where the maximum of the applied field saturates the shield material. After degaussing, the shield material can exhibit anhysteric magnetization properties such as nearly ideal permeability. Thus, it can be advantageous for each nested shield in a magnetic shielding system to be wrapped in a degaussing coil. Conventionally, shields are wrapped with solenoidal degaussing coils but toroidal degaussing coils can also be effective in some cases, such as those described in U.S. Pat. Nos. 8,441,330, 9,465,401, and U.S. Patent Publication No. 2016-0077380. In one implementation, a magnetic shielding system can include four concentric cylindrical shields, wherein the two innermost shields are formed from Finemet® and the two outermost shields are formed from mu-metal. Each shield can be wrapped by a toroidal degaussing coil and the degaussing coils may be electrically coupled in series.

Other important features to consider in designing a magnetic shielding system include the cross-sectional area or thickness of the shield and the geometry. In some cases, a thick cylindrical shield may provide adequate shielding for a sample. However, in most cases, effective shielding requires multiple layers of thin shields that are optimally spaced. Multi-layer shields are easy to manufacture and spacing between shields can be adjusted so that the shielding system behaves similar to a single thick shield. For cylindrical shields, the length to diameter ratio should also be considered when designing a magnetic shielding system. Typically, a larger ratio will result in better shielding for both transverse and longitudinal fields. However, it can sometimes be impractical to manufacture and assemble very long shields with a relatively small diameter. Additionally, in some cases, shields with non-cylindrical geometries can be implemented in a magnetic shielding system. For example, a spherical shield can achieve a uniform low-magnetic field environment but can be difficult to manufacture.

One approach to shielding external fields is to apply shield caps at the ends of a shield. Shield caps can also operate on the principle of minimizing reluctance so that flux preferentially follow paths that lead away from the sample. Thus, shield caps are conventionally formed from a thick, high permeability material. Alternatively, shield caps may be highly permeable, thin, and multi-layered. The geometry of shield caps can be important in drawing flux away from a sample. Past approaches include the use of conical or hemispherical shield caps that increase path length or geometric distance of flux to a sample. Such shield caps can divert longitudinal fields in the radial direction towards shield walls, away from the sample.

For some applications, it can be advantageous to design a magnetic shielding system that can achieve low-magnetic field environment on the order of nanoTeslas. Conventional shields have a constant radius, permeability, and thickness in the axial direction. Such shields typically redirect flux in the radial direction. It can be advantageous to vary radius, permeability, thickness, or any combination of these features in the axial direction to achieve better shielding by redirecting transverse fields in the axial direction. Likewise, conventional shield caps have a constant permeability and thickness in the radial direction. Varying the permeability, thickness, and flux path length in the radial direction can improve shielding by redirecting longitudinal fields in the radial direction towards shield walls.

An approach to designing a shield that can redirect transverse fields in the axial direction is to vary the permeability. An axial permeability gradient can be achieved by employing high permeability materials at the ends of a shield and materials with a comparatively lower permeability at the middle portion of the shield. One method of achieving such a variability is to stack or arrange films of materials in a way that forms a permeability gradient in the axial direction. Another method is to powder and sinter materials in a way that forms an axial permeability gradient. For example, when fabricating a shield, mu-metal and manganese-zinc can be powdered and sintered so that the distal ends of the shield substantially comprise mu-metal and the middle portion of the shield substantially comprises manganese-zinc. Mu-metal has a higher permeability than manganese-zinc, therefore this method can result in a gradual decrease in permeability as the shield is traversed longitudinally (e.g., axially) from one end to the middle. The same method can be applied in designing a shield cap that redirects longitudinal fields in the lateral (e.g., radial) direction. For example, mu-metal and manganese-zinc may be powdered and sintered in such a way that the perimeter of the shield cap substantially comprises mu-metal and the center of the shield substantially comprises manganese-zinc.

Another approach to designing a shield with effective transverse shielding is to vary the thickness along the axial direction which can be achieved in the manufacturing process. It is desirable for the shield to be thickest at the distal ends where the shield caps are attached and the least thick at the middle portion where the sample is positioned. Thickness can gradually decrease as the shield is traversed longitudinally from one end to the middle portion. For example, the inner radius of a shield can be constant and the outer radius can decrease as the shield is traversed longitudinally from one end to the middle portion. The same method can be applied in designing a shield cap that can effectively shield longitudinal fields. For example, the thickness of the shield cap may decrease as the shield cap is traversed from the perimeter to the center.

Geometry of a shield can also be adjusted to improve shielding. While a cylindrical shield with a constant radius is the most common geometry, a constant radius geometry does not redirect flux in the axial direction. Thus, a shield that has an outward longitudinal curvature can improve shielding by increasing flux path length and geometric distance from the sample, redirecting transverse flux in the axial direction towards the shield ends. Therefore, reluctance at the shield walls is comparatively lower than reluctance at the shield ends and transverse flux lines can be diverted away from the sample in the axial direction.

Degaussing coils may be employed in magnetic shielding systems to remove residual magnetization or remanence from shielding layers. Typically, a degaussing coil is wrapped around a portion of a shield. Systems comprising more than one shield can have multiple degaussing coils that are electrically coupled in series to a current source, preferably an alternating current that gradually decreases. An example of a magnetic shielding system that employs degaussing coils is described in U.S. Pat. No. 9,465,401. Improper degaussing can lead to imbalanced domain ordering or non-uniform magnetization direction, particularly for the inner most shielding layers in a multi-layered shielding system. In order to minimize external fields and field gradients, shields typically need to be degaussed many times but residual fields almost always remain. Small perturbations such as noise currents as low as 100 µA in a degaussing signal are sufficient to create imbalances in domain ordering. Typical shielding materials have a high permeability and relatively low coercivity. Such materials are particularly sensitive to small perturbations. After each degaussing cycle, residual fields are likely to be stochastic, demonstrating large variances in both magnitude and direction.

One approach to achieving more consistent degaussing results is to employ materials that are less sensitive to perturbations in a degaussing signal. Such materials can have a low permeability and a high or moderate coercivity. Coercivity is the magnetizing force required to demagnetize a material. Typically, little attention is given towards coercivity of shielding materials and high permeability materials with maximal shielding factors are typically employed when designing a magnetic shielding system. However, coercivity can affect the amount of fluctuation in a current that is required to alter specific states of individual domains within the material. A low permeability can reduce flux density fluctuations and a high or moderate coercivity can increase the magnetizing force required to significantly alter the states of domains. Thus, a magnetic shielding system may employ an inner most shielding layer formed from a material of low permeability and high or moderate coercivity to achieve a low magnetic field environment. For example, an inner most shielding layer formed from an alloy comprising nickel, iron, and/or molybdenum such as Ad-Mu-80®, which is commercially available from Ad-vance Magnetics, Inc., may be positioned inside multiple concentric cylindrical shields formed from mu-metal or Finemet®. Finemet® has a low coercivity of approximately 2.5 A/m and Ad-Mu-80® has a moderate coercivity of approximately 40 A/m. The thickness of the inner most shielding layer may be determined from the required shielding factor and the residual field typically left behind by the nearest shield, for example, the nearest mu-metal or Finemet® shield. Generally, a material that is suitable for the inner most shielding layer has a permeability that is approximately 15% that of a typical soft magnetic shielding material and a coercivity that is at least five times greater than most soft magnetic materials employed in transformer applications, such as Ad-Mu-80®.

The above approaches can be used alone or in combination and are not limited to cylindrical shields or shield caps with circular cross-sections. In one implementation, a shield can be cubic or rectangular with rounded perimeters or polygonal (e.g., hexagonal, octagonal) and can be used with shield caps that can be substantially square or pyramidal in shape. The cubic or rectangular or polygonal shield can be thicker and have a higher permeability at the ends than at the middle portion.

An example magnetic shielding system can employ nested magnetic shields and a superconducting shield. A magnetic shielding system can achieve a low-magnetic field environment for a superconducting device that is coupled to an input/output (IO) system. The superconducting device and the IO system can be at least partially enclosed in the superconducting shield. The IO system can include a sample holder that holds the superconducting device and a cryostat or cryogenic refrigeration system that lowers the temperature to below a critical temperature, for example, 15 mK. The IO system can include signal lines that communicatively couple the superconducting device to a cryostat and to room temperature electronics. In some cases, gradient coils or compensation coils that actively compensate external fields can be positioned proximate the superconducting device. Nested shields that are positioned coaxially can at least partially enclose the superconducting shield and can employ shield caps that are detachably fixed to the ends of each shield. The nested shields can operate at or near a critical temperature (e.g., cryogenic temperature) and each shield can be formed from different high permeability materials from another shield in the system. In some applications, it is desirable for shields to have minimal or no remanence. To achieve this, shields can be wrapped in solenoidal or toroidal degaussing coils that are electrically coupled in series to an alternating current source.

The present application describes a shield that has a permeability, thickness, and/or radius that varies along the axial (e.g., longitudinal) direction. Such a shield can redirect transverse fields in the axial direction. The present application also describes a shield cap that has a permeability and/or thickness that varies along the radial (e.g., lateral) direction. Such a shield cap can redirect longitudinal fields in the radial direction. One or more of the described shields and shield caps can be employed in the aforementioned example magnetic shielding system. In such implementations, permeability and geometry can vary individually or concurrently along the axial (e.g. longitudinal) for shields or along the radial (e.g., lateral) direction for shield caps.

Figure 1A:
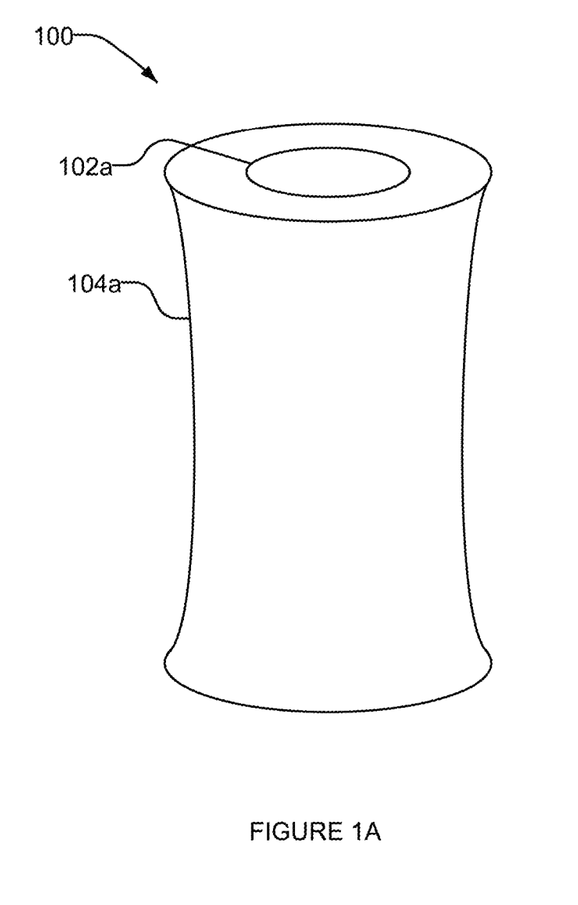
FIG. 1A and FIG. 1B are respectively a perspective view and a sectional view of an example shield having a thickness that varies along the axial direction.
Figure 1B:
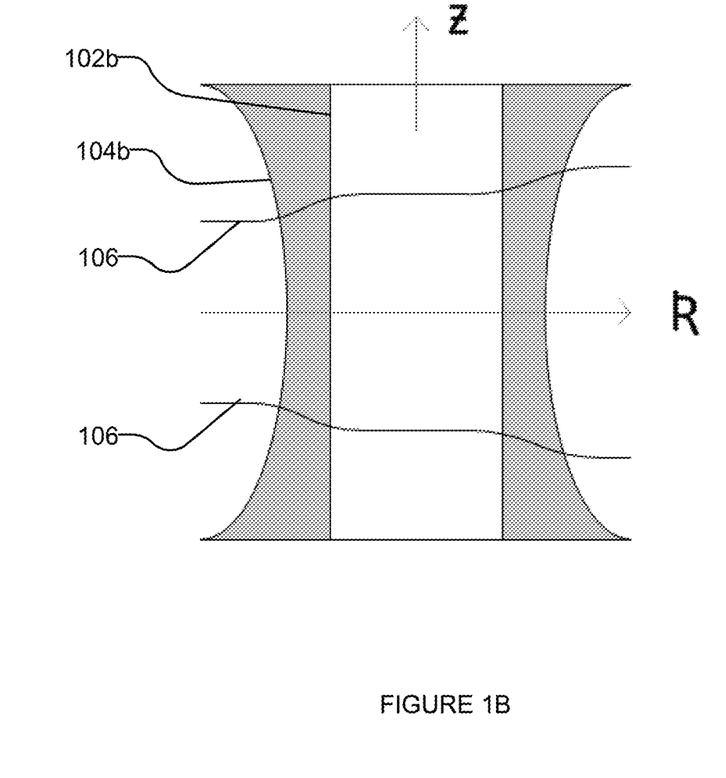

FIG. 1A and FIG. 1B are respectively a perspective view and a sectional view of an example shield 100 having a thickness that varies along the axial or longitudinal direction of the shield 100. The axial direction is denoted by z in FIG. 1B. Shield 100 is formed from a material that has a constant permeability along the axial and radial directions as represented by the solid gray. Shield 100 has a thickness defined by an inner surface 102a and 102b (collectively 102) and an outer surface 104a and 104b (collectively 104). Inner surface 202 has a radius that is constant along the axial direction. Outer surface 104 has a radius that gradually decreases as the shield is traversed from one end to the middle portion (i.e., approximately halfway between the ends of the shield) along the axial direction. Thus, thickness and cross-sectional area of shield 100 is greater at the ends than at the middle portion. Reluctance, denoted by $\mathcal{R}$ in FIG. 1B, is inversely proportional to cross-sectional area. Therefore, flux lines 106 are diverted away from the middle of the shield along the axial direction, following paths of low reluctance towards the ends of shield 100. In one implementation, inner surface 202 may have a radius that gradually increases along the axial direction as the shield is traversed from one end to the middle portion and outer surface 104 may have a radius that is constant along the axial direction. In another implementation, inner surface 202 may have a radius that gradually increases along the axial direction and outer surface 104 may have a radius that gradually decreases along the axial direction as the shield is traversed from one end to the middle portion. In some cases, shield 100 may be formed from one of the following materials: mu-metal, permalloy, Finemet®, or a soft ferrite.

Figure 2A:
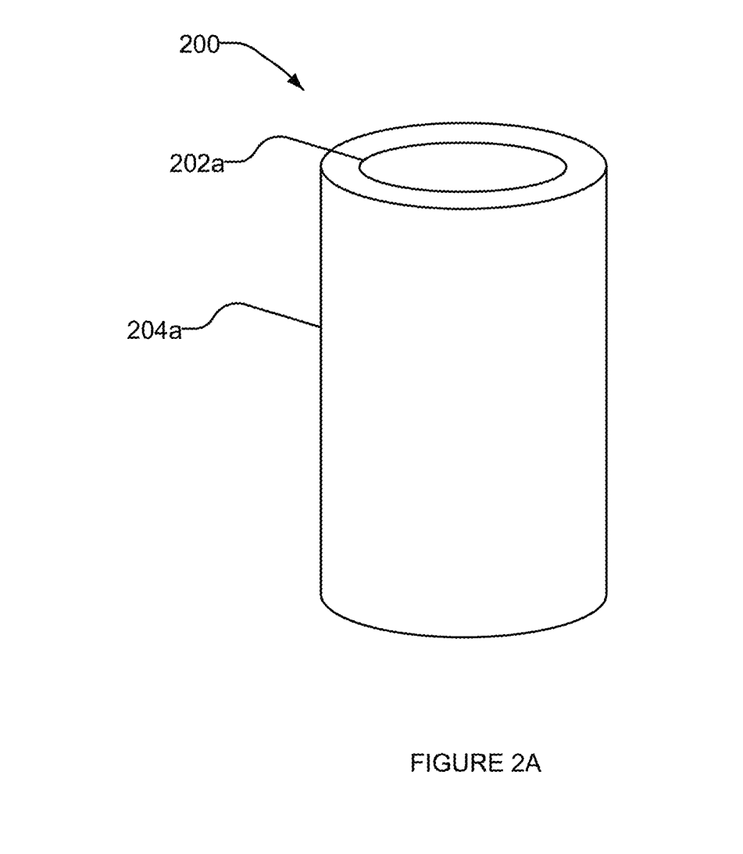
FIG. 2A and FIG. 2B are respectively a perspective view and a sectional view of an example shield having a magnetic permeability that varies along the axial direction.
Figure 2B:
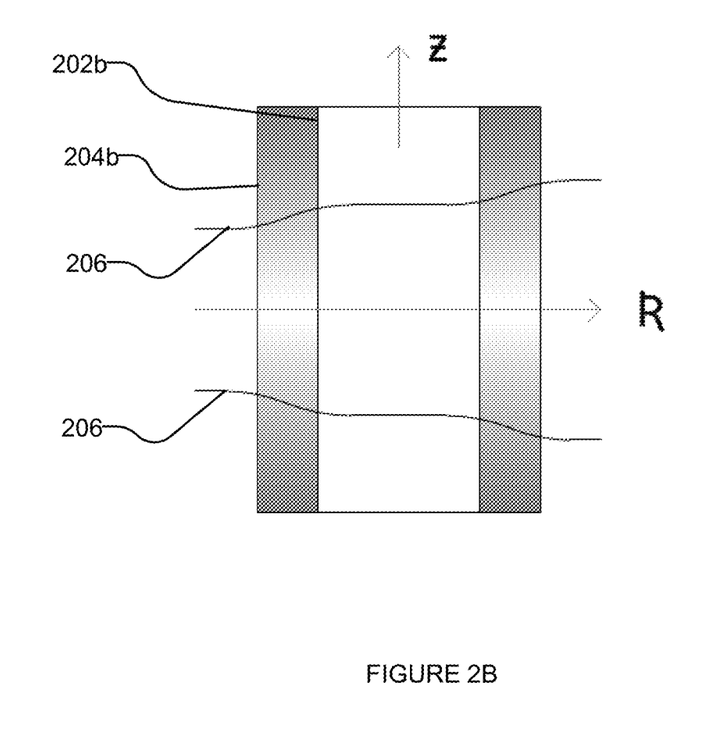

FIG. 2A and FIG. 2B are respectively a perspective view and a sectional view of an example shield 200 having a magnetic permeability that varies along the axial or longitudinal direction of shield 200. Shield 200 has a thickness that is constant along the axial direction. Thickness is defined by an inner surface 202a and 202b (collectively 202) and an outer surface 204a and 204b (collectively 204). Permeability of shield 200 is represented by gray shading in FIG. 2B, where a darker shade of gray indicates a higher permeability. Permeability of shield 200 gradually decreases as the shield is traversed from one end to the middle portion along the axial direction. Shield 200 is more permeable and has lower reluctance at the ends than at the middle portion because reluctance is inversely proportional to permeability. Therefore, flux lines 206 are diverted away from the middle of the shield, following paths of low reluctance towards the ends of shield 200. Shield 200 may comprise at least one of the following materials: mu-metal, Finemet®, and ferrite. Examples of ferrites that can be implemented include manganese-zinc or nickel-zinc. The materials may constitute shield 200 in a way that forms a permeability gradient. For example, the ends of shield 200 with dark gray shading may substantially comprise mu-metal and the middle portion of shield 200 with white or light gray shading may substantially comprise a comparatively lower-permeability material such as manganese-zinc. In one implementation, the radius of inner surface 202 may increase proportionally with permeability as shield 200 is traversed from one end to the middle portion along the axial direction. In another implementation, the radius of outer surface 204 may decrease proportionally with permeability as shield 200 is traversed from one end to the middle portion along the axial direction.

Figure 3A:
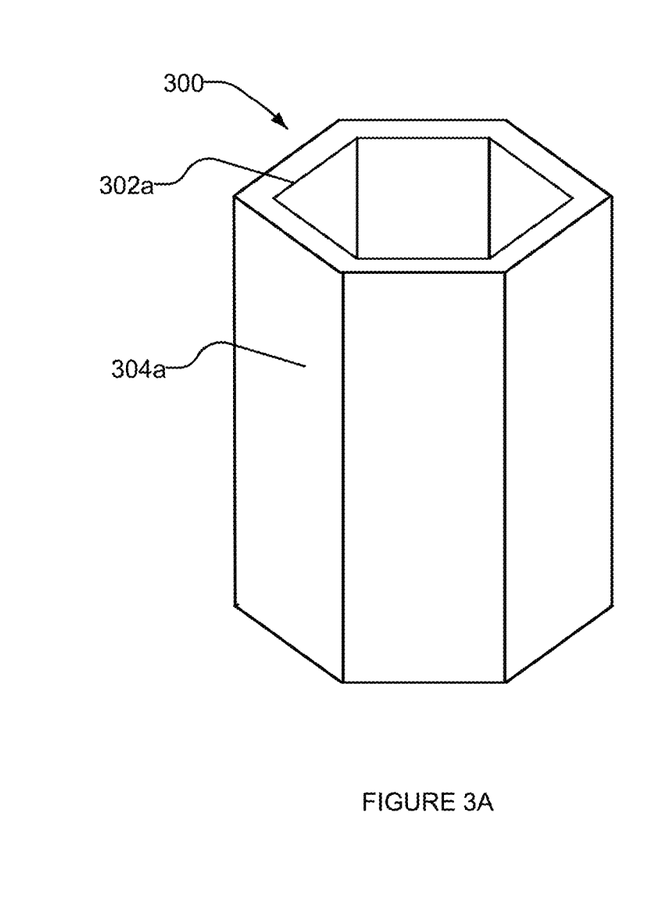
FIG. 3A and FIG. 3B are respectively a perspective view and a sectional view of an example hexagonal shield having a magnetic permeability that varies along the axial direction.
Figure 3B:
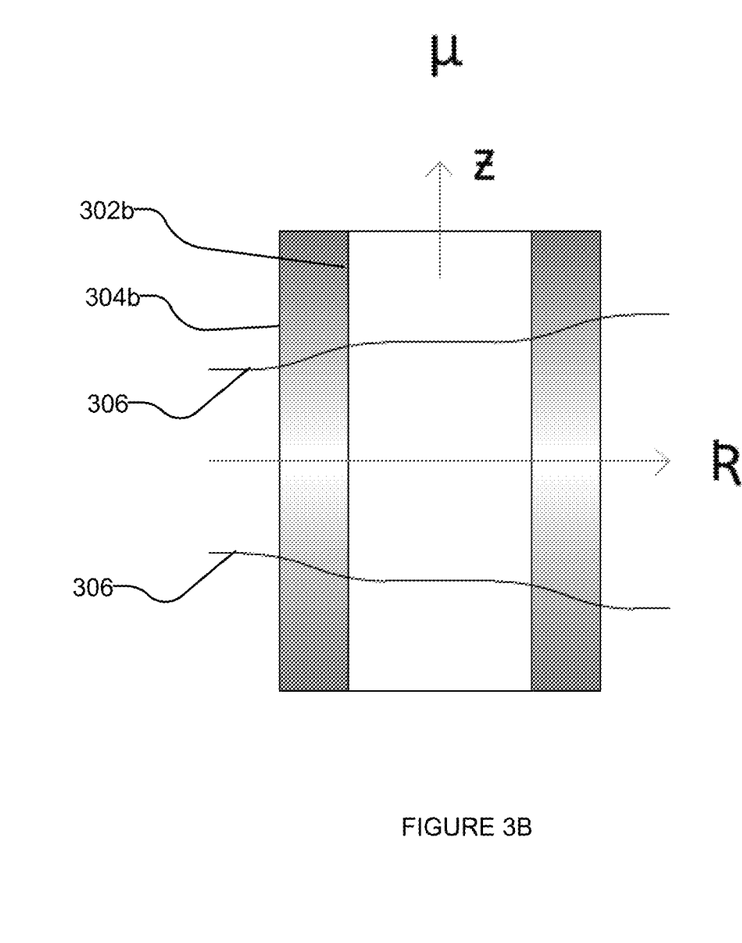

In variations of the above implementation, the radii of inner surface 202 and outer surface 204 may vary concurrently and proportionally with permeability as shield 200 is traversed from one end to the middle portion along the axial direction. As shown in FIG. 3A and FIG. 3B, shields with a varying magnetic permeability may have a geometry that is polygonal (e.g., rectangular, hexagonal, octagonal).

FIG. 3A and FIG. 3B are respectively a perspective view and a sectional view of an example hexagonal shield 300 having a magnetic permeability that varies along the axial direction. Shield 300 has an inner surface 302a and 302b (collectively 302) and an outer surface 304a and 304b (collectively 304) that together define a thickness. Gray shading in FIG. 3B represents permeability of FIG. 3B, where a darker shade of gray indicates a higher permeability. Shield 300 is more permeable and has a lower reluctance at the shield ends compared to the middle portion. Thus, flux lines 306 are diverted away from the middle of the shield and preferentially follow low-reluctance paths towards the ends of shield 300. In some implementations, shield 300 may have a polygonal cross-section that is not hexagonal. For example, shield 300 may have a rectangular or octagonal cross-section and a permeability that varies in the axial direction.

Figure 4A:
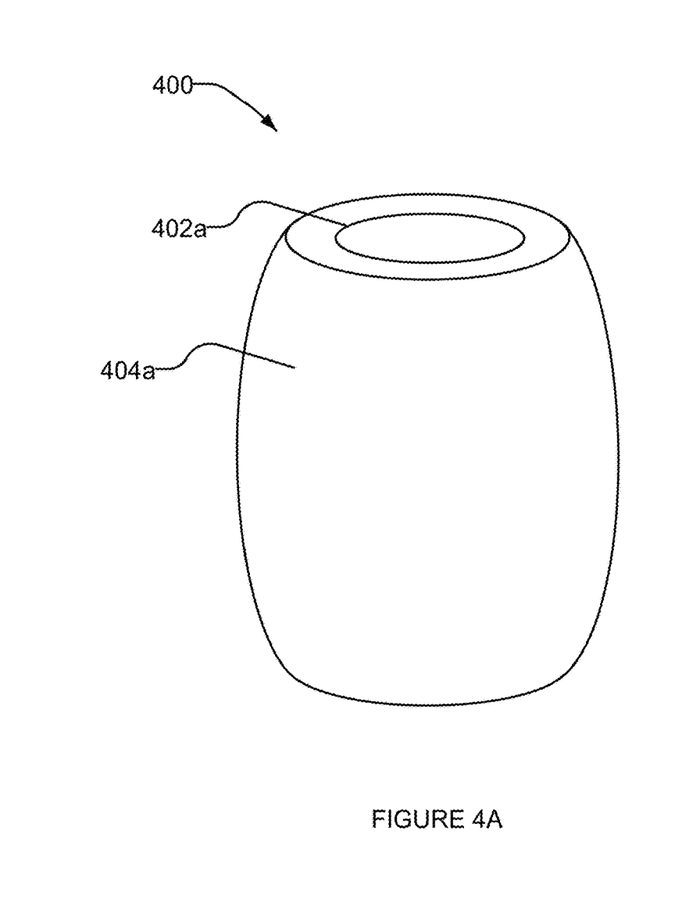
FIG. 4A and FIG. 4B are respectively a perspective view and a sectional view of an example shield having an inner radius and an outer radius that vary concurrently along the axial direction.
Figure 4B:
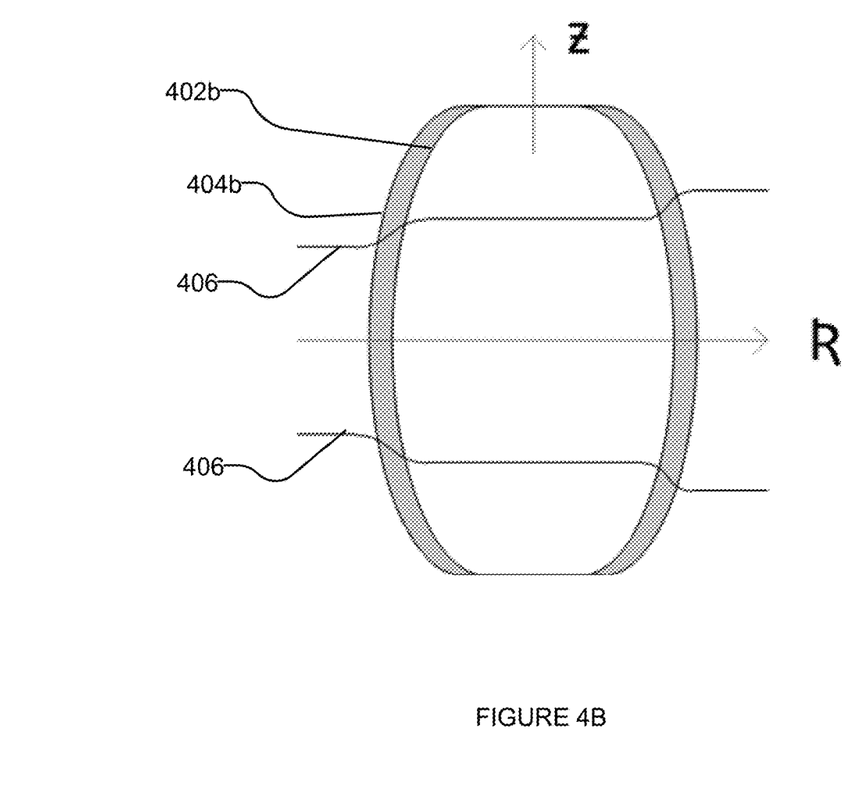

FIG. 4A and FIG. 4B are respectively a perspective view and a sectional view of an example shield 400 having an inner radius and an outer radius that vary concurrently along the axial or longitudinal direction. Shield 400 is formed from a material that has a constant permeability along the axial and radial directions as represented by the solid gray. Shield 400 has a thickness defined by an inner surface 402a and 402b (collectively 402) and an outer surface 404a and 404b (collectively 404). The radius of inner surface 402 and radius of outer surface 404 vary concurrently along the axial direction. The radius of inner surface 402 and the radius outer surface 404 concurrently increase as shield 400 is traversed from one end to the middle portion along the axial direction. Shield 400 has a greater flux path length and high reluctance at the middle portion of the shield relative to reluctance at the ends of shield 400 because reluctance is proportional to flux path length. Therefore, flux lines 406 are diverted away from the middle of the shield, following paths of comparatively lower reluctance towards the ends of shield 400. In one implementation, inner radius 402 can increase and outer radius 404 can decrease while permeability is constant as the shield is traversed from one end to the middle portion along the axial direction. In another implementation, inner radius 402 can increase and outer radius 404 and permeability can both be constant as the shield is traversed from one end to the middle portion along the axial direction.

Figure 5A:
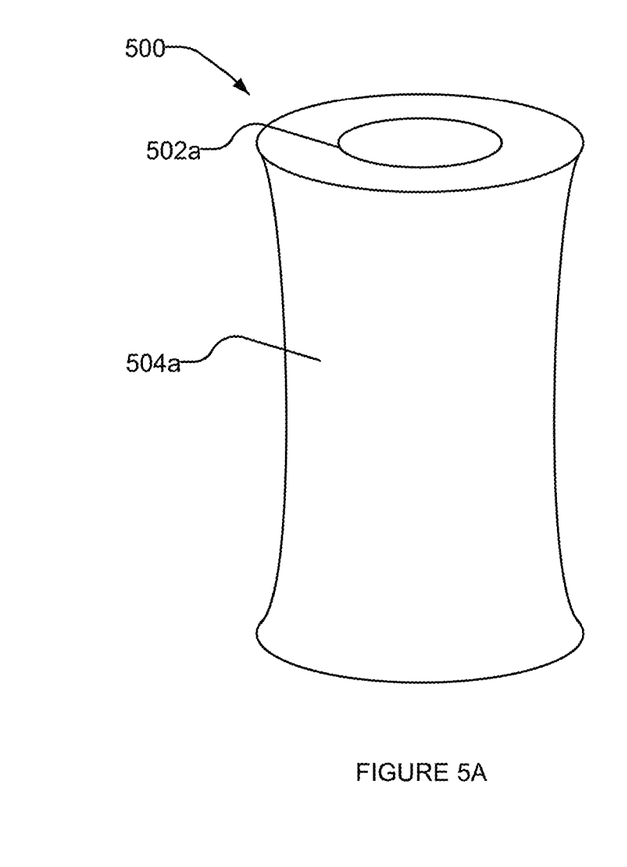
FIG. 5A and FIG. 5B are respectively a perspective view and a sectional view of an example shield having a thickness and a magnetic permeability that each vary along the axial direction.
Figure 5B:
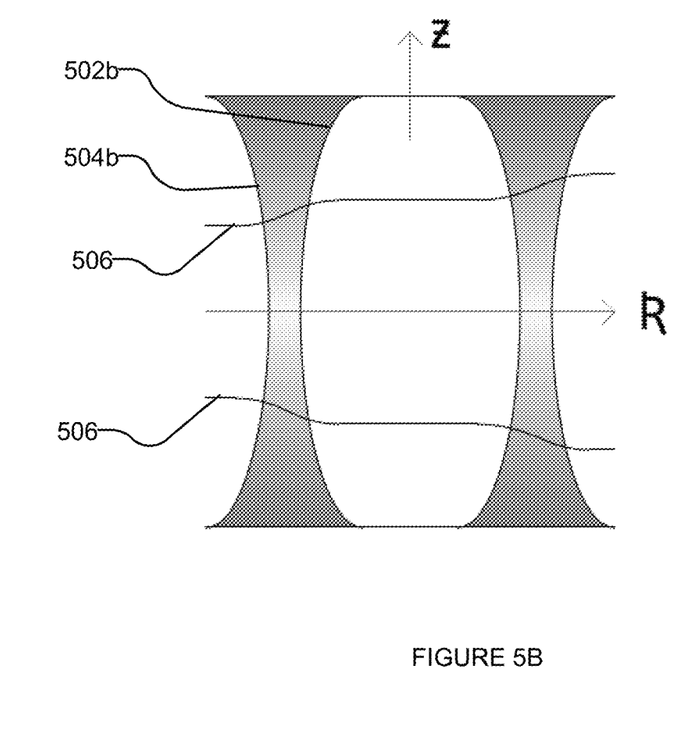

FIG. 5A and FIG. 5B are respectively a perspective view and a sectional view of an example shield 500 having a thickness and a magnetic permeability that each vary along the axial or longitudinal direction. Shield 500 has an inner surface 502a and 502b (collectively 502) and an outer surface 504a and 504b (collectively 504) that together define a thickness. Permeability of shield 500 is represented by gray shading in FIG. 5B where a darker shade of gray indicates a higher permeability. Thickness and permeability of shield 500 gradually decreases as shield 500 is traversed from one end to the middle portion along the axial direction. In particular, the radius of inner surface 502 increases and the radius of outer surface 504 decreases as shield 500 is traversed from one end to the middle portion. Shield 500 is more permeable and thicker at the ends than at the middle portion along the axial direction. Thus, reluctance is lower at the ends than at the middle portion of shield 500 because reluctance is inversely proportional to permeability and cross-sectional area of shield 500. Flux lines 506 are diverted away from the middle of shield 500, following paths of low reluctance towards the ends of shield 500. Shield 500 may be formed from at least one of the following materials: mu-metal, Finemet®, manganese-zinc, and nickel-zinc. These materials may constitute shield 500 in a way that a permeability gradient is formed. For example, the ends of shield 500 that have dark gray shading may substantially comprise mu-metal and the middle portion of shield 500 with white or light gray shading may substantially comprise a comparatively lower-permeability material such as manganese-zinc.

Figure 6A:
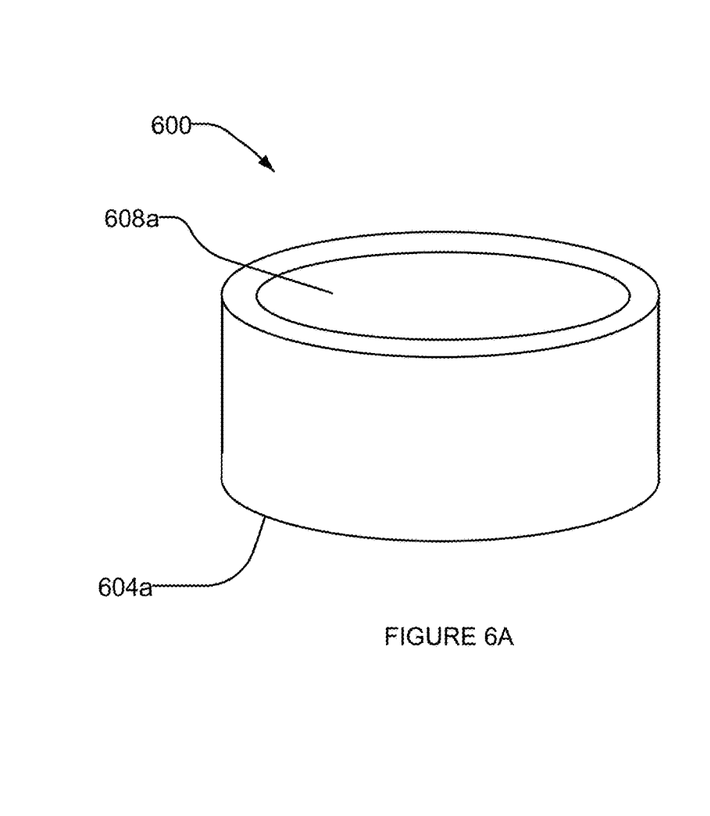
FIG. 6A and FIG. 6B are respectively a perspective view and a sectional view of an example shield cap having a thickness that varies along the radial direction.
Figure 6B:
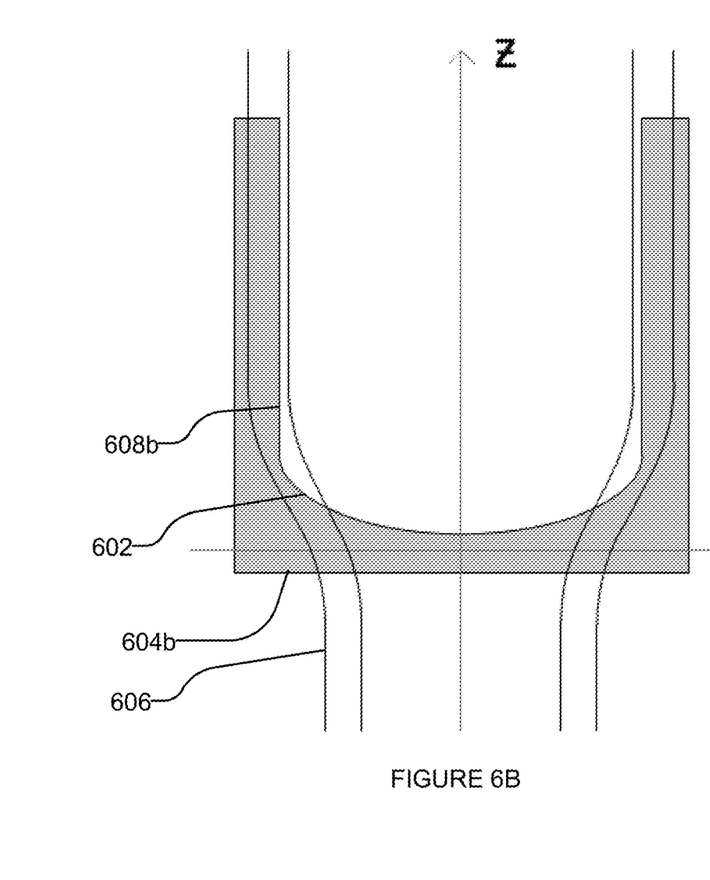

FIG. 6A and FIG. 6B are respectively a perspective view and a sectional view of an example shield cap 600 having a thickness that varies along the radial or lateral direction of the shield cap, and hence along a radial direction of the shield to which the shield cap 600 will be coupled. Shield cap 600 has a constant permeability as indicated by the solid gray shading. Shield cap 600 has a closed end that is plano-concave. For example, an inner surface 602 is concave and an outer surface 604a and 604b (collectively 604) is planar. A thickness of the closed end of shield cap 600 is defined by inner surface 602 and outer surface 604. The closed end of shield cap 600 is a portion that can cover an end of a shield, for example, shield 200 in FIG. 2A and FIG. 2B. Shield cap 600 also has an open end that is opposite to the closed end. The open end is demarcated by a flange 608a and 608b (collectively 608) that is integrally formed with the closed end of shield cap 600. Flange 608 can fit to an outer surface of a shield to form a seal that prevents flux leakage. Thickness increases along the radial direction as shield cap 600 is traversed radially from the center along the radial direction, where radius denoted by r equals zero, to an inner surface of flange 608. In particular, inner surface 602 of shield cap 600 is concave, curving away from an inner volume that is bound by flange 608 and inner surface 602. Outer surface 604 is flush as shield 600 is traversed radially from the center to flange 608 along the radial direction. Reluctance is inversely proportional to cross-sectional area. Thus, reluctance is lower at a portion of shield cap 600 where flange 608 is integrally formed with the closed end of shield cap 600. Flux lines 606 are diverted away from the center of shield cap 600 towards flange 608, following paths of low reluctance. Shield cap 600 can be used to cover an end of a shield, for example, shield 200 in FIGS. 2A and 3B, and flux lines 606 can be diverted away from the center towards the shield walls. In one implementation, inner surface 602 can be concave, curving away from the inner volume and outer surface 604 can be symmetrically concave, curving towards the inner volume of shield 600. Alternatively, inner surface 602 can be planar and outer surface 604 can be concave, curving towards the inner volume of shield 600. In one implementation, flange 608 can be parallel with a center longitudinal axis, denoted by z in FIG. 6B. Alternatively, flange 608 can curve longitudinally inward or outward to fit the outer surface of a shield. In some implementations, the inner volume of shield cap 600 may have a cross-section that is polygonal. In variations of the above implementations, flange 608 can extend past outer surface 604 to form a projecting collar at the perimeter of shield cap 600. For some applications, shield cap 600 can be used to cover at least one end of shields 200, 300, 400, and 500 in FIGS. 2A and 2B, FIGS. 3A and 3B, FIGS. 5A and 5B, and FIGS. 6A and 6B, respectively.

Figure 7A:
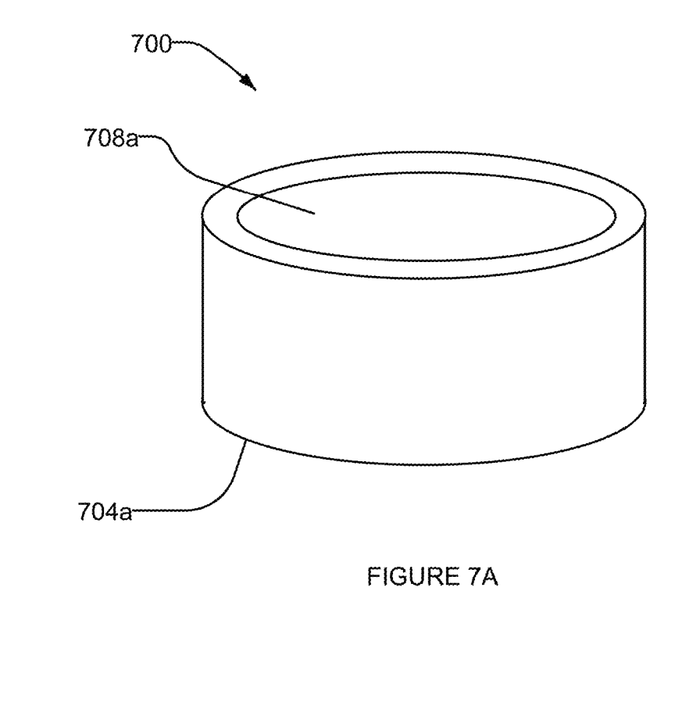
FIG. 7A and FIG. 7B are respectively a perspective view and a sectional view of an example shield cap having a magnetic permeability that varies along the radial direction.
Figure 7B:
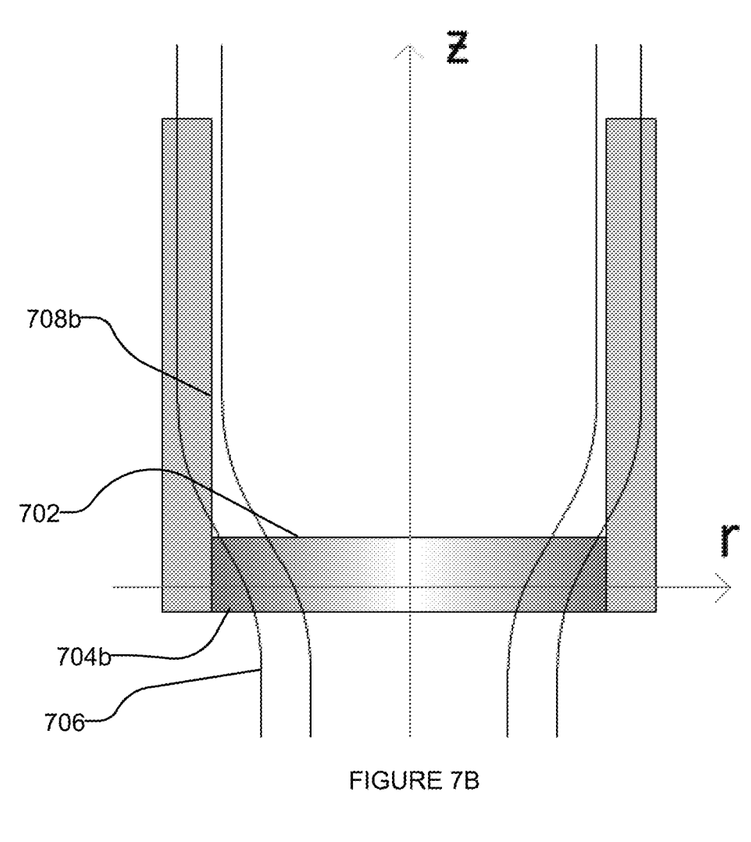

FIG. 7A and FIG. 7B are respectively a perspective view and a sectional view of an example shield cap 700 having a magnetic permeability that varies along the radial or longitudinal direction. Shield cap 700 has a closed end that has a constant thickness defined by an inner surface 702 and an outer surface 704a and 704b (collectively 704). Inner surface 702 and outer surface 704 are planar. The closed end of shield cap 700 is a portion that can cover an end of a shield, for example, shield 200 in FIG. 2A and FIG. 2B. Shield cap 700 also has an open end that is opposite to the closed end. The open end is demarcated by a flange 708a and 708b (collectively 708) that is joined or integrally formed with the closed end of shield cap 700. Flange 708 can fit to an outer surface of a shield to form a seal that prevents flux leakage. Permeability of shield 700 is represented by gray shading in FIG. 7B where a darker shade of gray indicates a higher permeability. Permeability gradually increases along the radial direction as shield cap 700 is traversed radially from the center to flange 708 along the radial direction. Reluctance is inversely proportional to permeability. Thus, reluctance is lower at a portion of shield cap 700 where flange 708 is joined or integrally formed with the closed end of shield cap 700. Flux lines 706 are diverted away from the center of shield cap 700 towards flange 708, following paths of low reluctance. When shield cap 700 is used to cover an end of a shield, for example, shield 200 in FIGS. 2A and 3B, flux lines 706 are diverted away from the center towards the shield walls. Shield cap 700 may be formed from at least one of the following materials: mu-metal, Finemet®, manganese-zinc, and nickel-zinc. These materials may constitute shield cap 700 in a way that a permeability gradient is formed. For example, a portion of shield cap 700 to which flange 708 is fixed or integrally formed (i.e., where gray shading is darker) may substantially comprise mu-metal and the center of shield cap 700 where gray shading is lighter may substantially comprise a comparatively lower-permeability material such as manganese-zinc. In one implementation, thickness of shield cap 700 can increase proportionally with permeability along the radial direction. For example, inner surface 702 can be concave, curving away from an inner volume that is bound by flange 708 and inner surface 702 and permeability may be higher where flange 708 is joined or integrally formed with the closed end than at the center of shield cap 700. In some implementations, flange 708 can be parallel to a center longitudinal axis or can curve longitudinally outward or inward to fit the outer surface of a shield. In some cases, it can be beneficial for the inner volume of shield cap 700 to have a cross-sectional profile that is polygonal. In variations of the above implementations, flange 708 can extend past outer surface 704 to form a projecting collar at the perimeter of shield cap 700. For some applications, shield cap 700 can be used to cover at least one end of shields 200, 300, 400, and 500 in FIGS. 2A and 2B, FIGS. 3A and 3B, FIGS. 5A and 5B, and FIGS. 6A and 6B, respectively.

Figure 8:
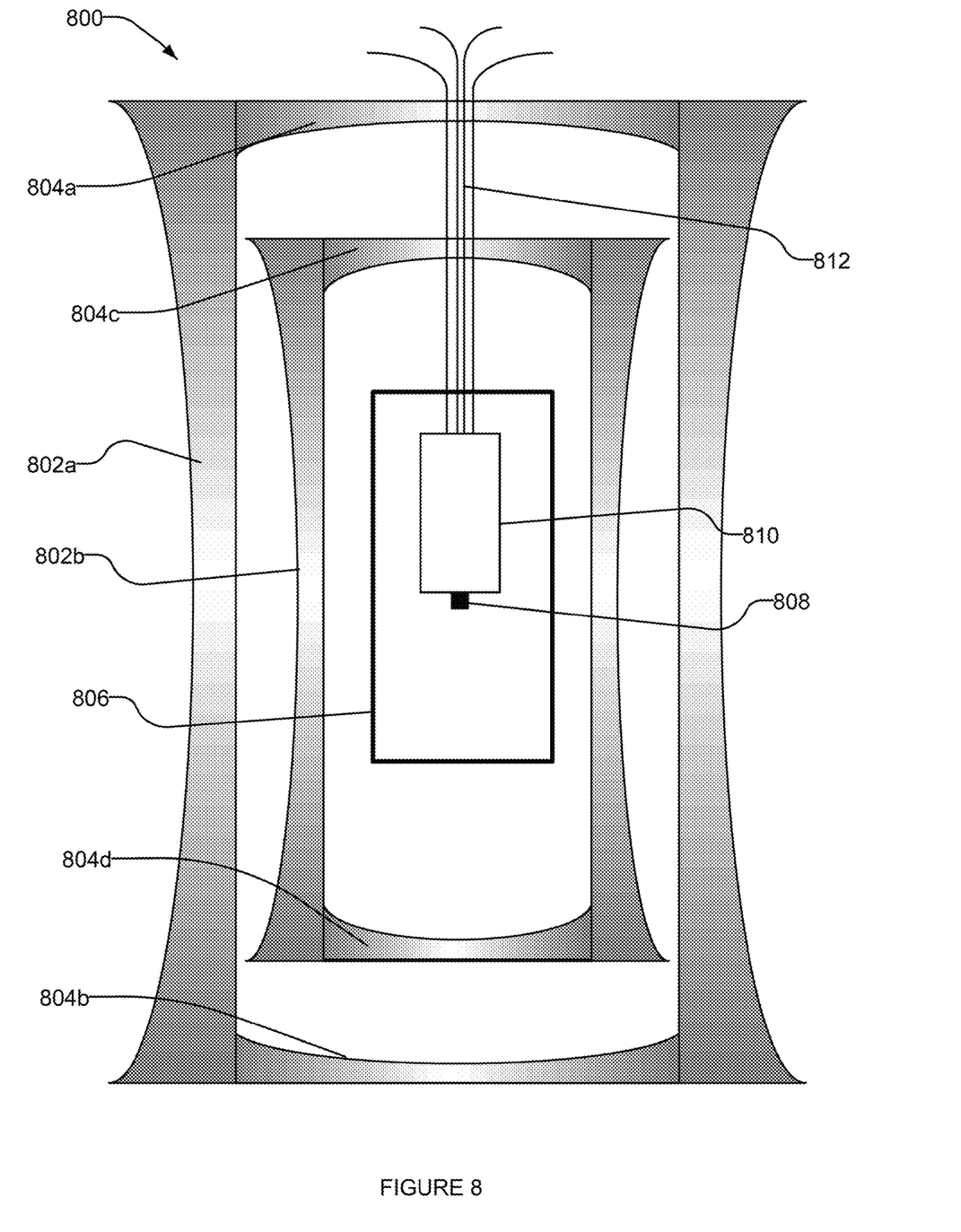
FIG. 8 is a sectional view of an example magnetic shielding system that includes nested shields and shield caps, wherein each shield and shield cap has a thickness and a magnetic permeability that varies.

FIG. 8 is a sectional view of an example magnetic shielding system 800 that includes nested shields 802a and 802b (collectively and individually 802) and shield caps 804a, 804b, 804c, and 804d (collectively and individually 804), and superconducting shield 806. Shields 802 and shield caps 804 each have a thickness and a permeability that is non-uniform. Magnetic shielding system 800 shields a superconducting computing system comprising a superconducting device 808, a cryostat or refrigeration system 810, and electrical wiring 812. Superconducting device 808 can be a superconducting quantum processor. Shield 802a has an inner volume bound by shield caps 804a and 804b and shield 802a. Shield 802b and shield caps 804c and 804d are at least partially enclosed in the inner volume of shield 802a. Shield 802b, shield 802a, and shield caps 804c and 804d are substantially coaxial. Shields 802 each have two ends that are opposite to each other and a middle portion that is a region between the two ends. Shields 802 each combine the features of shield 100 in FIG. 1 and shield 200 in FIG. 2. Shields 802 each have a permeability gradient and a thickness that varies along the axial or longitudinal direction. Permeability is represented by gray shading where a darker shade of gray indicates a higher permeability. An outer surface of each shield 802 is concave, curving inwards towards a center longitudinal axis. Permeability and thickness of each shield 802 increases as the shields 802 are traversed from the middle portion to the ends along the axial direction. The ends of shields 802 are covered by shield caps 804 that are similar to shield cap 700 in FIG. 8. Shield caps 804 each have a planar surface forming a closed end that covers an end of shield 802. Shield caps 804 can have an opening that is shaped to accommodate electrical wiring 812. Shield caps 804 have a constant thickness and a permeability gradient along the radial or lateral direction. For each shield cap 804, permeability increases as shield cap 804 is traversed radially from the center to the perimeter along the radial direction. Reluctance is inversely proportional to permeability and cross-sectional area; therefore, reluctance is low at the perimeter of shield cap 804 and at the ends of shield 802. Flux preferentially follows paths of low reluctance. Transverse fields are redirected in the axial direction by shields 802 towards shield caps 804 and longitudinal fields are redirected by shield caps 804 towards the walls of shields 802. Thus, flux is redirected away from superconducting chip 808 in all three dimensions. It can be advantageous to employ at least one material to establish a permeability gradient in shields 802 and shield caps 804. For example, high permeability regions can be formed substantially from mu-metal and comparatively lower permeability regions can be formed substantially from manganese-zinc.

Magnetic shielding system 800 further employs superconducting shield 806 to redirect flux away from superconducting chip 808 and cryostat 810. Superconducting shield 806 is at least partially enclosed in the inner volume of shield 804d and is substantially coaxial with shield 804d. Superconducting shield 806 can be formed from at least one of: tin, copper, and aluminum. For example, superconducting shield may be formed from tin-plated copper. In some implementations, shield 802b, shield caps 804c and 804d, superconducting shield 806, cryostat 810, and superconducting chip 808 may operate at or below a critical temperature (e.g. cryogenic temperature). Shield 802a and shield caps 804a and 804b may operate at room temperature. In such implementations, superconducting chip 808 and cryostat 810 are communicatively coupled with room temperature components via electrical wiring 812.

In some implementations, it can be advantageous for magnetic shielding system 800 to have compensation coils or gradient coils that actively compensate magnetic fields. Compensation coils or gradient coils may be at least partially enclosed in an inner volume of superconducting shield 806 and positioned operationally proximate to superconducting chip 808. For example, active compensation coils described in U.S. Pat. No. 9,465,401 can be implemented in magnetic shielding system 800. In some cases, it can be advantageous for magnetic shielding system 800 to employ gradient coils that actively compensate external field gradients in all directions. In such cases, magnetic shielding system 800 can employ gradient coils that establish at least one countervailing gradient to shield superconducting device 808.

Magnetic shielding system 800 includes two nested shields but it can be advantageous to employ more than two nested shields. The permeability, thickness, or radius of each nested shield can be non-uniform or uniform along the axial direction. For example, magnetic shielding system 800 can further include a cylindrical mu-metal shield that has a constant thickness. Such a shield can be interposed between shield 802b and superconducting shield 806 in a way that shield 802b at least partially encloses the shield and superconducting shield 806. For some applications, it can be advantageous to cover only one end of shield 802 with shield cap 804 and for the opposite end to be open. In some implementations, each shield 802 may employ a respective toroidal or solenoidal degaussing coil and degaussing coils may be electrically coupled in series.

Figure 9:
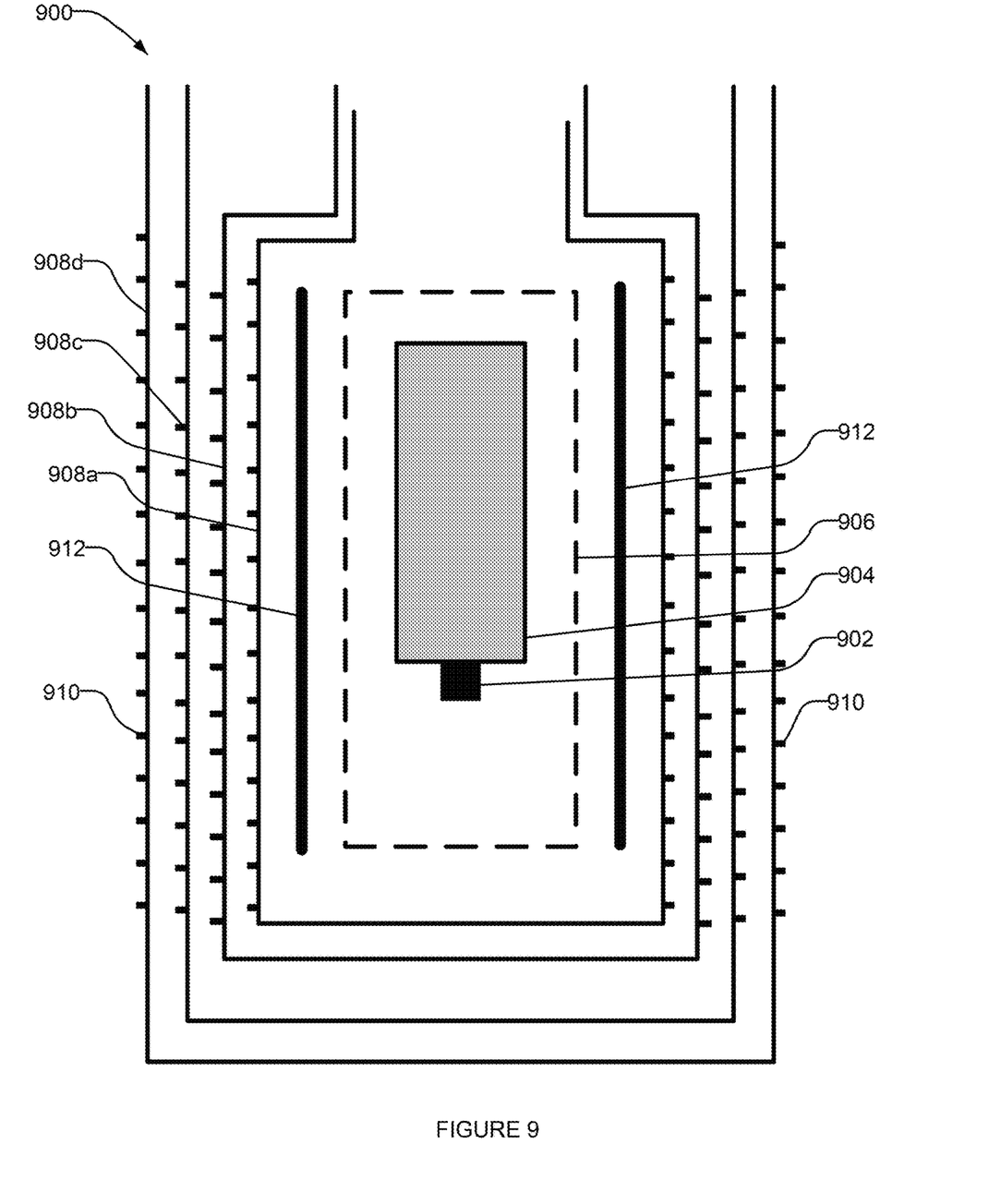
FIG. 9 is a sectional view of an example magnetic shielding system 900 that employs nested magnetic shields and an inner shielding layer with low permeability and high coercivity.

FIG. 9 is a sectional view of an example magnetic shielding system 900 that employs nested magnetic shields 908a, 908b, 908c, 908d (collectively 908), an inner shielding layer 912, and a superconducting shield 906. Magnetic shields 908 each employ a degaussing coil 910 (only one labeled in FIG. 9) that is electrically coupled to a gradually decreasing alternating current source. In one implementation, degaussing coils 910 are coupled to each other in series. Degaussing coils 910 remove residual magnetization from shields 908 to achieve a uniform, low-magnetic field environment for a superconducting device 902 and 10 system 904. Superconducting device 902 and 10 system 904 are at least partially enclosed in superconducting shield 906. Due to perturbations in the current source for degaussing coils 910, shields 908 may have imbalanced domain ordering. Thus, inner shielding layer 912 is implemented to reduce sensitivity to perturbations in degaussing coils 910 thereby achieving consistent degaussing results. Inner shielding layer 912 has a low permeability and high coercivity relative to shields 908. For example, inner shielding layer 912 may have a permeability that is approximately 15% of the permeability of shield 908a. In one implementation, inner shielding layer 912 is formed from a nickel-iron alloy such as Ad-Mu-80. Inner shielding layer at least partially encloses superconducting shield 906. Shields 908a and 908b are concentric and at least partially enclose inner shielding layer 912, superconducting shield 906, 10 system 904, and superconducting device 902. In one implementation, shields 908a and 908b are formed from Finemet® and each shield can employ a shield cap. Shields 908c and 908d are concentric and at least partially enclose shields 908a and 908b, inner shielding layer 912, superconducting shield 906, 10 system 904, and superconducting device 902. Shields 908 and inner shielding layer 912 may be substantially coaxial. In one implementation, shields 908c and 908d are formed from mu-metal. The thickness and/or radius of inner shielding layer 912 may vary in the axial direction. In some cases, inner shielding layer 912 may be used in combination with magnetic shielding system 800 of FIG. 8.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations described above can be combined to provide further implementations. All of the commonly assigned U.S. patent application publications, U.S. patent applications, foreign applications, and foreign patent applications referred to in this specification and/or listed in the Application Data Sheet are incorporated herein by reference, in their entirety, including but not limited to: U.S. Provisional Application No. 62/598,296, U.S. Pat. Nos. 7,533,068, 8,195,596, 8,190,548, and U.S. Patent Application No. 2011-0022820, U.S. Pat. No. 7,619,437, U.S. Publication No. 2008-0238531 A1, U.S. Pat. Nos. 5,173,660, 8,355,765, 8,441,330, 9,465,401, U.S. Patent Publication No. 2017-0077380, and U.S. Pat. No. 9,465,401.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A magnetic shielding system for use with a superconducting computing system, the magnetic shielding system comprising:
a first and a second shield cap, each shield cap having a thickness that varies in along at least a portion of a lateral direction, a magnetic permeability that varies along at least a portion of the lateral direction, and an opening shaped to accommodate electrical wiring;
a first shield having an inner volume bound by an inner surface of the first shield, the first shield cap, and the second shield cap;
a superconducting shield that is at least partially enclosed in the inner volume of the first shield; wherein
the first shield has a magnetic permeability and a thickness that both vary along an axial direction;
the first shield cap is detachably joined to a first end of the first shield; and
the second shield cap is detachably joined to a second end of the first shield, the second end positioned opposite to the first end.

2. The magnetic shielding system of claim 1, further comprising a second shield that has an inner volume, wherein the first shield is at least partially enclosed in the inner volume of the second shield, and the second shield is detachably joined to a third shield cap at a first end of the second shield.

3. The magnetic shielding system of claim 2, further comprising a fourth shield cap that is detachably joined a second end of the second shield, the second end of the second shield positioned opposite to the first end of the second shield.

4. The magnetic shielding system of claim 2 wherein the first shield and the second shield each comprise at least one material selected from the group of: mu metal, permalloy, and ferrite.

5. The magnetic shielding system of claim 1, wherein the superconducting shield at least partially encloses at least a portion of the superconducting computing system.

6. The magnetic shielding system of claim 1 wherein the thickness of the first shield decreases along the at least a portion of the axial direction as the shield is traversed from the first end to the middle portion of the shield, the thickness sized to minimize reluctance at the first end of the shield.

7. The magnetic shielding system of claim 1 wherein an outer surface of the first shield curves longitudinally inward towards the center longitudinal axis.

8. The magnetic shielding system of claim 1 wherein the first shield comprises a first material selected from a group of: mu-metal, permalloy, and ferrite.

9. The magnetic shielding system of claim 1 wherein the first and second shield caps have a thickness that increases as the first and second shield caps are traversed from the center longitudinal axis to the perimeter, the thickness sized to minimize reluctance at the perimeter.

10. The magnetic shielding system of claim 1 wherein the superconducting shield comprise at least one material selected from the group of: tin, copper, and aluminum.

* * * * *